United States Patent [19]
Ryou

[11] Patent Number: 5,470,776
[45] Date of Patent: Nov. 28, 1995

[54] METHOD FOR FABRICATING STACKED DYNAMIC RANDOM ACCESS MEMORY CELL

[75] Inventor: Eui K. Ryou, Kyoungki-do, Rep. of Korea

[73] Assignee: Hyundai Electronics Industries Co., Ltd., Rep. of Korea

[21] Appl. No.: 366,677

[22] Filed: Dec. 30, 1994

[30]   Foreign Application Priority Data

Dec. 31, 1993 [KR] Rep. of Korea ............. 93-31910

[51] Int. Cl.$^6$ ............. H01L 21/70; H01L 27/00
[52] U.S. Cl. ............. 437/52; 437/60; 437/915; 437/919
[58] Field of Search ............. 437/47, 52, 60, 437/919, 915

[56]   References Cited

U.S. PATENT DOCUMENTS

| | | | |
|---|---|---|---|
| 5,137,842 | 8/1992 | Chan et al. | 437/48 |
| 5,389,560 | 2/1995 | Park | 427/52 |

*Primary Examiner*—Olik Chaudhuri
*Assistant Examiner*—H. Jey Tsai
*Attorney, Agent, or Firm*—Merchant, Gould, Smith, Edell, Welter & Schmidt

[57]   ABSTRACT

A method for fabricating a DRAM cell, capable of obtaining an increased threshold voltage of a metal oxide semiconductor field effect transistor of the DRAM cell, minimizing current leakage and punchthrough phenomenons between adjacent active regions, and increasing the number of unit chips two times by carrying out a lightly doped drain ion implantation in a specific DRAM cell structure for lightly doping a drain while eliminating a high concentration ion implantation.

6 Claims, 4 Drawing Sheets

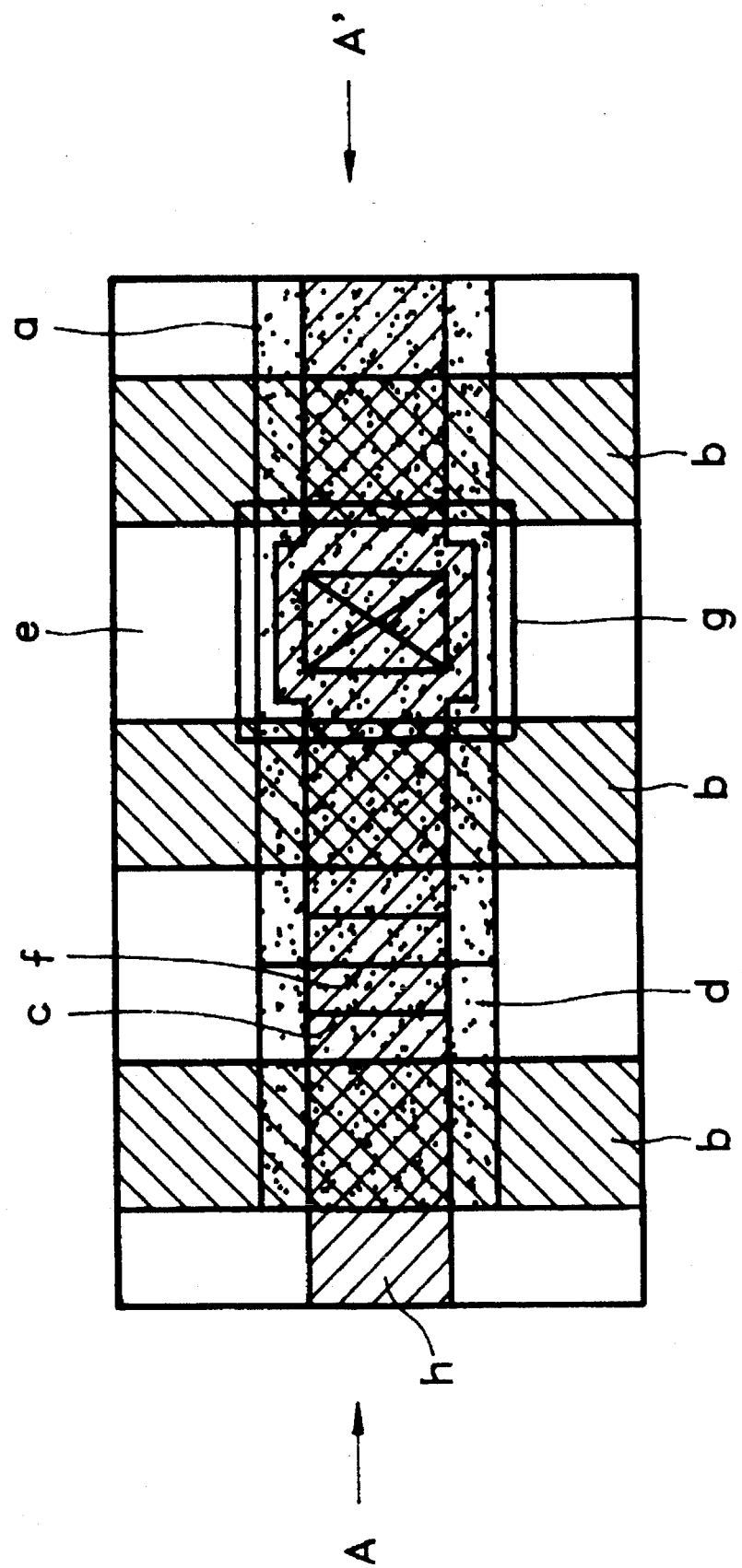

METHOD FOR FABRICATING STACKED DYNAMIC RANDOM ACCESS MEMORY CELL

BACKGROUND OF THE INVENTION

1. Field of the Invention

The present invention relates to a method for fabricating a dynamic random access memory (DRAM) cell, and mole particularly, to a method for fabricating a DRAM cell, capable of obtaining an increased threshold voltage of a metal oxide semiconductor field effect transistor (MOSFET) of the DRAM cell, minimizing current leakage and punch-through phenomenons between adjacent active legions, and increasing the number of unit chips two times by carrying out a lightly doped drain ion implantation in a specific DRAM cell structure for lightly doping a drain while eliminating a high concentration ion implantation.

2. Description of the Prior Art

Generally, high integration of a DRAM inevitably involves a reduction in chip area and a reduction in cell area. However, such a reduction is difficult to achieve with existing equipment. Despite the development of sophisticated techniques, it has only been possible to achieve a limited reduction in cell area.

A conventional method for fabricating a DRAM will be briefly described. First, a field oxide film is formed on a semiconductor substrate. Thereafter, growth of a gate oxide film is carried out. Over the resulting structure, a polysilicon film is deposited. Following the deposition of the polysilicon film, an impurity implantation is carried out to form a gate electrode and a wold line pattern. Subsequently, formation of a MOSFET is carried out. The MOSFET has an active region formed with a lightly doped drain structure by use of a spacer oxide film in order to improve an electrical characteristic thereof. Over the entire exposed surface of the resulting structure, an insulating oxide film is then deposited to a predetermined thickness. The insulating oxide film is selectively etched so that a contact hole is formed at the drain region of the MOSFET. Thereafter, a doped polysilicon layer or a polycide layer is deposited in the contact hole such that it is in contact with the drain region of the MOSFET. Also, formation of a bit line electrode having a predetermined dimension is formed using a mask. Over the entire exposed surface of the resulting structure, an insulating oxide film is then deposited to a predetermined thickness. The insulating oxide film is selectively etched so that a contact hole is formed at the source region of the MOSFET. Thereafter, a doped polysilicon layer is deposited in the contact hole such that it is in contact with the source region of the MOSFET. Also, formation of a storage electrode having a predetermined dimension is formed using a mask. Subsequently, a dielectric film is grown over the storage electrode. The dielectric film has a composite structure such as a nitride-oxide (NO) composite structure or an oxide-nitride-oxide (ONO) composite structure. Over the entire exposed surface of the resulting structure, a doped polysilicon layer is then formed. The polysilicon layer is patterned to form a plate electrode. Thus, a DRAM is fabricated.

As the integrated semiconductor device fabricated in the above-mentioned manner has a higher integration degree, it becomes more difficult to fabricate such integrated semiconductor device when the existing process capability is taken into consideration.

SUMMARY OF THE INVENTION

Therefore, an object of the present invention is to provide a DRAM cell having a new structure fabricated to achieve a high integration thereof by use of existing fabrication processes and a method for fabricating the DRAM cell.

In accordance with the present invention, this object can be accomplished by providing a method for fabricating a semiconductor dynamic random access memory, comprising the steps of: forming a field oxide film and a bulk metal oxide semiconductor field effect transistor having source and drain active regions of a lightly doped drain structure in a well-known manner; depositing a first insulating film to a predetermined thickness over the entire exposed surface of the resulting structure obtained after the formation of the transistor, selectively etching a portion of the first insulating film disposed over the source active region of the transistor using a storage electrode contact hole mask, forming a first storage electrode having a predetermined dimension such that it is in contact with the source active region of the bulk transistor, forming a first dielectric film over the first storage electrode, forming a first plate electrode, and depositing a second insulating film over the entire exposed surface of the resulting structure; depositing a third insulating film over the entire exposed surface of the resulting structure obtained after the deposition of the second insulating film, planarizing the third insulating film, and forming a thin film metal oxide semiconductor field effect transistor having a lightly doped drain structure and serving as a switch of an upper cell, over the third insulating film; depositing a fourth insulating film over the entire exposed surface of the resulting structure obtained after the formation of the thin film transistor, forming a second storage electrode by use of a storage electrode contact hole such that it is in contact with a source active region of the thin film transistor, forming a dielectric film having a composite structure over the second storage electrode, and forming a second plate electrode; and depositing a fifth insulating film and a sixth insulating film over the entire exposed surface of the resulting structure obtained after the formation of the second plate electrode, selectively etching the sixth insulating film and the fifth insulating film, the fourth insulating film, the drain active region of the thin film transistor, a substrate of the thin film transistor, the third insulating film, the second insulating film and the first insulating film in a sequential manner using a bit line contact hole mask so that the drain active region of the bulk transistor is exposed, and forming a bit line such that it is in contact with the drain active region of the bulk transistor.

BRIEF DESCRIPTION OF THE DRAWINGS

Other objects and aspects of the invention will become apparent from the following description of embodiments with reference to the accompanying drawings in which:

FIG. 1 is a plan view illustrating a layout of masks employed in accordance with the present invention.

DETAILED DESCRIPTION OF THE PREFERRED EMBODIMENTS

Figure 2A:
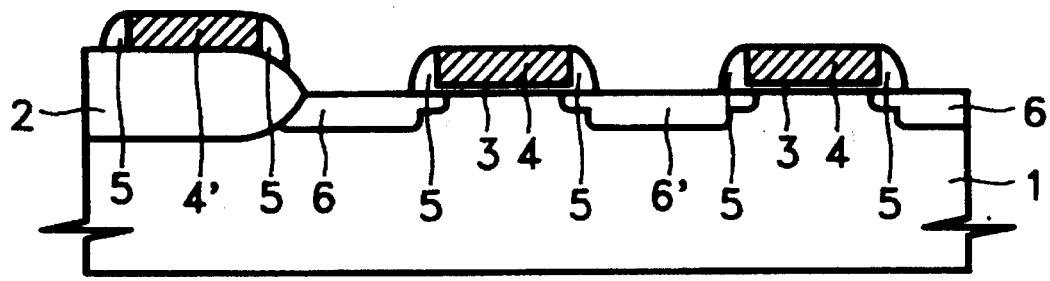
FIGS. 2A to 2E are cross-sectional views respectively taken along the line A–A' of FIG. 1, illustrating a method for fabricating the DRAM cell in accordance with the present invention.

Referring to FIG. 1, these is illustrated a layout of a DRAM cell, showing masks employed in accordance with the present invention. On the other hand, FIGS. 2A to 2E are cross-sectional views respectively taken along the line A–A' of FIG. 1, illustrating a method fox fabricating the DRAM cell in accordance with the present invention.

In FIG. 1, the reference character a denotes an isolation region mask, b a gate electrode/word line mask, c a storage electrode contact hole mask, d a storage electrode mask, e a plate electrode mask, f a thin film MOSFET substrate mask, g a bit line contact hole mask, and h a bit line electrode mask.

In accordance with the illustrated method, first, a field oxide film 2 is grown on a semiconductor wafer 1 formed with a P-well (or an N-well) using a local oxidation of silicon (LOCOS) process, as shown in FIG. 2A. A first gate oxide film 3 and a first polysilicon layer for gate electrode/ word line are then deposited on the semiconductor wafer 1 without any time delay. Impurity ions are then implanted in the first polysilicon layer. Using the gate electrode/word line mask b, the first polysilicon layer is partially etched, thereby forming a first gate electrode 4 and a word line pattern 4'. Thereafter, N type (or P type) impurity ions are implanted in a low concentration in exposed portions of the semiconductor wafer 1. A first spacer oxide film 5 is then formed on side walls of the first gate electrode 4 and word line pattern 4'. N type (or P type) impurity ions are then implanted in a high concentration in exposed portions of the semiconductor wafer 1, thereby forming a bulk MOSFET having active regions 6 and 6' of the lightly doped drain (LDD) structure.

Figure 2B:
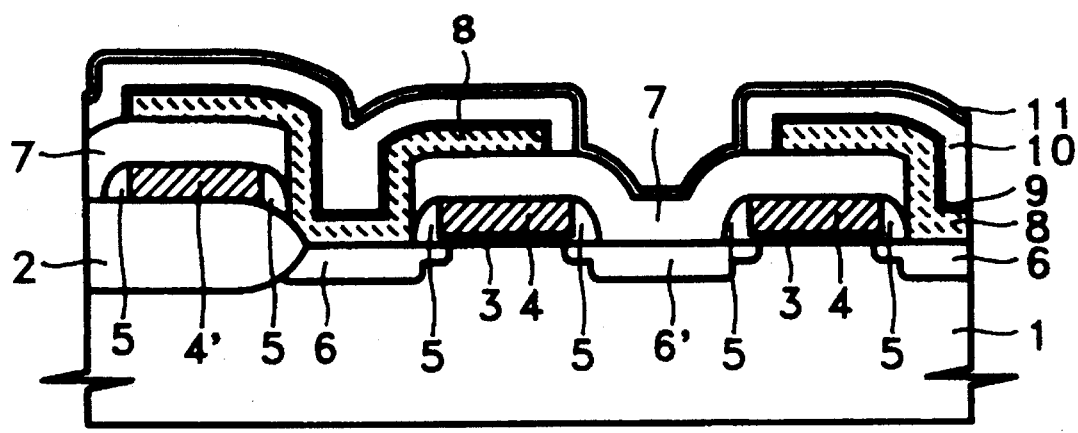

Over the entire exposed surface of the resulting structure, a first insulating film 7 is then deposited to a predetermined thickness, as shown in FIG. 2B. The first insulating film 7 is then selectively etched at its portion disposed over the source active region 6 of the bulk MOSFET using the storage electrode contact hole mask c. A second polysilicon layer having a predetermined thickness is then deposited over the entire exposed surface of the resulting structure such that it is in contact with the source active region 6. Using the storage electrode mask d, the second polysilicon layer is then patterned to form a first storage electrode 8. Thereafter, a first dielectric film 9 is formed over the first storage electrode 8. Over the entire exposed surface of the resulting structure, a third polysilicon layer is then deposited. Using the plate electrode mask e, the third polysilicon layer is then pattern to form a first plate electrode 10. Over the entire exposed surface of the resulting structure, a second insulating film 11 having a predetermined thickness is then deposited.

Figure 2C:
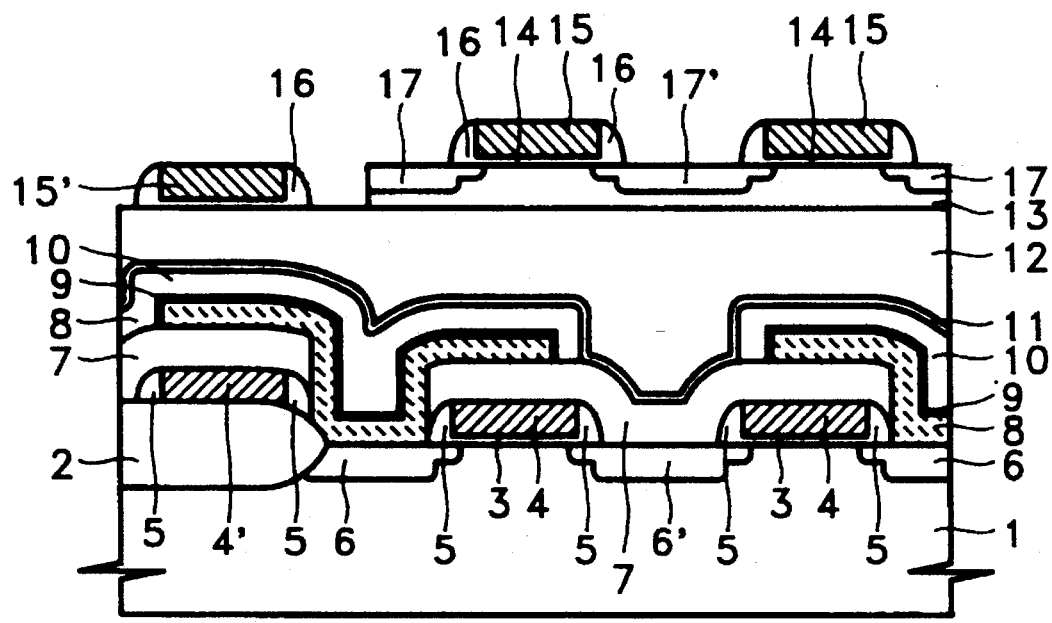

Thereafter, a third insulating film 12 is deposited to a predetermined thickness over the entire exposed surface of the resulting structure, as shown in FIG. 2C. The third insulating film 12 is then planarized. Over the planarized third insulating film 12, a fourth polysilicon layer 13 to serve as a substrate of a thin film MOSFET is then deposited. The resulting structure is then subjected to a re-crystallization process or a thermal process. Using the thin film MOSFET substrate mask f, portions of the MOSFET except for a portion to be used as the substrate are removed. Subsequently, a second gate oxide film 14 and a fifth polysilicon layer for gate electrode/word line are deposited on the resulting structure without any time delay. Impurity ions are then implanted in the fifth polysilicon layer. Using the gate electrode/word line mask b, the fifth polysilicon layer is partially etched, thereby forming a second gate electrode 15 and a word line pattern 15'. Thereafter, N type (or P type) impurity ions are implanted in a low concentration in exposed portions of the substrate 13. A second spacer oxide film 16 is then formed on side walls of the second gate electrode 15 and word line pattern 15'. N type (or P type) impurity ions are then implanted in a high concentration in exposed portions of the substrate 13, thereby forming a thin film MOSFET having active regions 17 and 17' of the LDD structure.

Figure 2D:
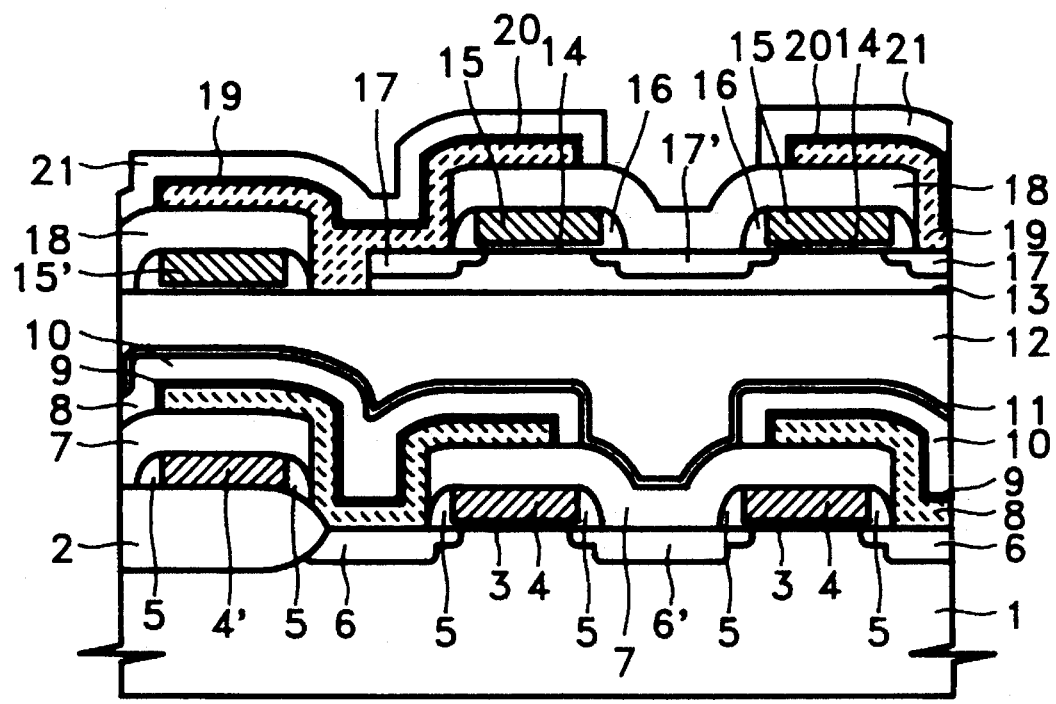

Over the entire exposed surface of the resulting structure, a fourth insulating film 18 is then deposited to a predetermined thickness, as shown in FIG. 2D. The fourth insulating film 18 is then selectively etched at its portion disposed over the source active region 17 of the thin film MOSFET using the storage electrode contact hole mask c. A sixth polysilicon layer having a predetermined thickness is then deposited over the entire exposed surface of the resulting structure such that it is in contact with the source active region 17. Using the storage electrode mask d, the sixth polysilicon layer is then patterned to form a second storage electrode 19. Thereafter, a second dielectric film 20 is formed over the second storage electrode 19. Over the entire exposed surface of the resulting structure, a seventh polysilicon layer is then deposited. Using the plate electrode mask e, the seventh polysilicon layer is then patterned to form a second plate electrode 21.

Figure 2E:
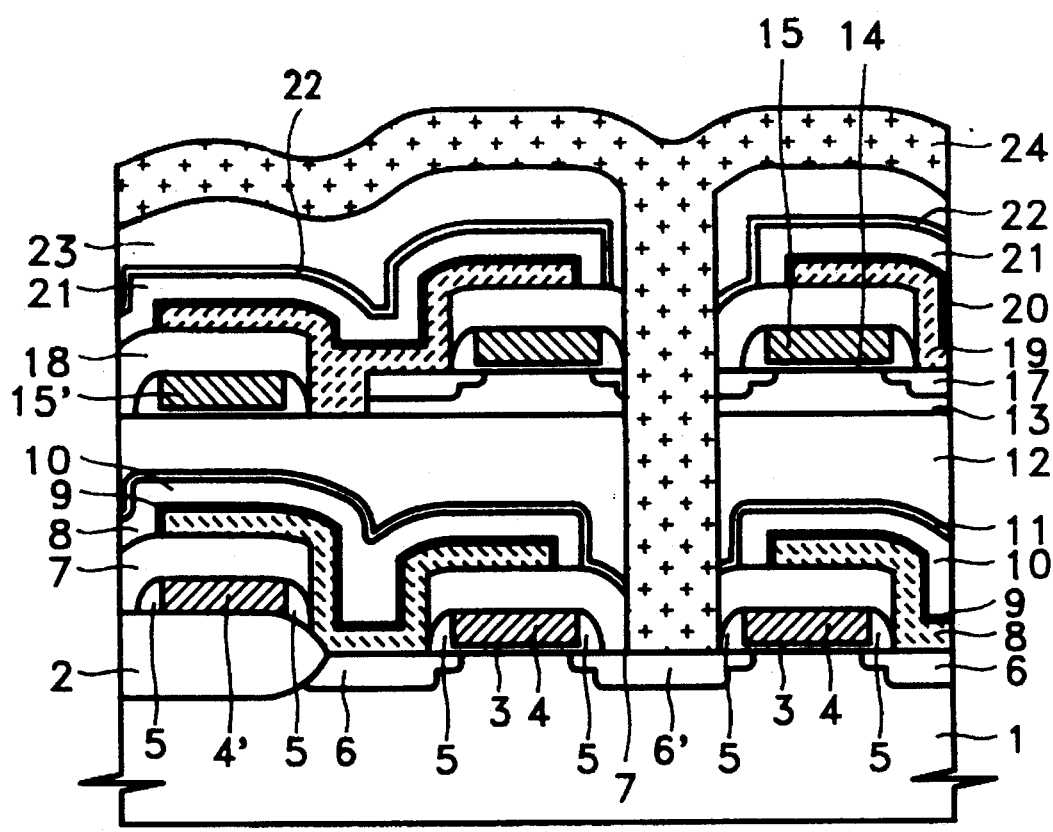

Subsequently, a fifth insulating film 22 and a sixth insulating film 23 are deposited over the entire exposed surface of the resulting structure, as shown in FIG. 2E. Thereafter, the sixth insulating film 23, the fifth insulating film 22, the fourth insulating film 18, the drain active region 17' of the thin film MOSFET, the substrate 13, the third insulating film 12, the second insulating film 11 and the first insulating film 7 are selectively etched in a sequential manner using the bit line contact hole mask g so that the drain active region 6' of the bulk MOSFET is exposed. Over the entire exposed surface of the resulting structure, an eighth polysilicon layer (or a polycide layer) is then deposited such that it is in contact with the drain active region 6' of the bulk MOSFET. Using the bit line mask h, the eighth polysilicon layer is then patterned to form a bit line electrode. Thus, a DRAM cell is fabricated.

As apparent from the above description, the present invention provides a DRAM cell of a structure having an integration degree increased two times by those of the existing structures in the same area. This means that the number of unit chips can be increased two times as compared with conventional cases where wafers of the same area are used. Accordingly, it is possible to reduce the fabrication cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor dynamic random access memory, comprising the steps of:

growing a field oxide film on a semiconductor wafer formed with a P-well, sequentially depositing a first gate oxide film and a first polysilicon layer on the semiconductor wafer, implanting first N type impurity ions in the first polysilicon layer, etching the first polysilicon layer using a gate electrode/word line mask, thereby forming a first gate electrode and a word line pattern, then implanting second N type impurity ions in the semiconductor wafer, forming a first spacer oxide film on side walls of the first gate electrode and word line pattern, then implanting third N type impurity ions which have a higher concentration than said second N type impurity ions in the semiconductor wafer, thereby forming a metal oxide semiconductor field effect transistor having source and drain active regions with a lightly doped drain structure;

depositing a first insulating film on the resulting structure obtained after the formation of the transistor, selectively etching a portion of the first insulating film disposed over the source active region of the transistor using a storage electrode contact hole mask, then depositing a second polysilicon layer such that it is in contact with the source active region, patterning the second polysilicon layer using a storage electrode mask, thereby forming a first storage electrode, forming a first dielectric film over the first storage electrode, then depositing a third polysilicon layer, patterning the third polysilicon layer using a plate electrode mask, thereby forming a first plate electrode, then depositing a second insulating film;

depositing a third insulating film on the resulting structure obtained after the deposition of the second insulating film, planarizing the third insulating film, depositing a fourth polysilicon layer to serve as a substrate of a thin film metal oxide semiconductor field effect transistor over the polarized third insulating film, then subjecting the wafer to a recrystallization process or a thermal process, removing portions of the thin film transistor except for a portion to be used as the substrate using a thin film metal oxide semiconductor field effect transistor substrate mask, then depositing a second gate oxide film and a fifth polysilicon layer for gate electrode/word line;

implanting impurity ions in the fifth polysilicon layer, etching the fifth polysilicon layer using the gate electrode/word line mask, thereby forming a second gate electrode and a word line pattern, then implanting fourth N type impurity ions in the substrate; forming a second spacer oxide film on side walls of the second gate electrode and word line pattern, and implanting fifth N type impurity ions which have a higher concentration than the fourth N type impurity ions in the substrate, thereby forming the thin film transistor having source and drain active regions with a lightly doped drain structure;

depositing a fourth insulating film over the entire exposed surface of the resulting structure obtained after the formation of the thin film transistor, selectively etching a portion of the fourth insulating film disposed over the source active region of the thin film transistor using the storage electrode contact hole mask, the depositing a sixth polysilicon layer such that it is in contact with the source active region of the thin film transistor, and patterning the sixth polysilicon layer using the storage electrode mask, thereby forming a second storage electrode;

forming a second dielectric film over the second storage electrode, then depositing a seventh polysilicon layer, and patterning the seventh polysilicon layer using the plate electrode mask, thereby forming a second plate electrode; and depositing a fifth insulating film and a sixth insulating film over the entire exposed surface of the resulting structure obtained after the formation of the second plate electrode, selectively etching the sixth insulating film and the fifth insulating film, the fourth insulating film, the drain active region of the thin film transistor, the substrate, the third insulating film, the second insulating film and the first insulating film in a sequential manner using the bit line contact hole mask so that the drain active region of the transistor is exposed, then depositing an eighth polysilicon layer or a polycide layer such that it is in contact with the drain active region of the transistor, and patterning the eighth polysilicon layer using a bit line mask, thereby forming a bit line electrode.

2. A method in accordance with claim 1, wherein with respect to the steps of implanting N type impurity ions, those steps of implanting N type impurity ions in the higher concentration are omitted so that only those steps of implanting N type impurity ions to form the lightly doped drain structure are carried out.

3. A method in accordance with claim 1, wherein the sixth polysilicon layer for the second storage electrode is in contact with side walls of the source active region of the thin film transistor by use of an impurity implantation process.

4. A method for fabricating a semiconductor dynamic random access memory, comprising the steps of:

growing a field oxide film on a semiconductor wafer formed with an N-well, sequentially depositing a first gate oxide film and a first polysilicon layer on the semiconductor wafer, implanting first P type impurity ions in the first polysilicon layer, etching the first polysilicon layer using a gate electrode/word line mask, thereby forming a first gate electrode and a word line pattern, then implanting second P type impurity ions in the semiconductor wafer, forming a first spacer oxide film on side walls of the first gate electrode and word line pattern, then implanting third P type impurity ions which have a higher concentration then said second P type impurity ions in the semiconductor wafer, thereby forming a metal oxide semiconductor field effect transistor having source and drain active regions with a lightly doped drain structure;

depositing a first insulating film on the resulting structure obtained after the formation of the transistor, selectively etching a portion of the first insulating film disposed over the source active region of the transistor using a storage electrode contact hole mask, then depositing a second polysilicon layer such that it is in contact with the source active region, patterning the second polysilicon layer using a storage electrode mask, thereby forming a first storage electrode, forming a first dielectric film over the first storage electrode, the depositing a third polysilicon layer, patterning the third polysilicon layer using a plate electrode mask, thereby forming a first plate electrode, then depositing a second insulating film;

depositing a third insulating film on the resulting structure obtained after the deposition of the second insulating film, planarizing the third insulating film, depositing a fourth polysilicon layer to serve as a substrate of a thin film metal oxide semiconductor field effect transistor over the planarized third insulating film, then subjecting the wafer to a recrystallization process or a thermal process, removing portions of the thin film transistor except for a portion to be used as the substrate using a thin film metal oxide semiconductor field effect transistor substrate mask, then depositing a second gate oxide film and a fifth polysilicon layer for gate electrode/word line;

implanting impurity ions in the fifth polysilicon layer, etching the fifth polysilicon layer using the gate electrode/word line mask, thereby forming a second gate electrode and a word line pattern, then implanting fourth P type impurity ions in the substrate; forming a second spacer oxide film on side walls of the second gate electrode and word line pattern, and implanting fifth P type impurity ions which have a higher concentration than the fourth P type impurity ions in the substrate, thereby forming the thin film transistor having source and drain active regions with a lightly doped drain structure;

depositing a fourth insulating film over the entire exposed surface of the resulting structure obtained after the formation of the thin film transistor, selectively etching a portion of the fourth insulating film disposed over the source active region of the thin film transistor using the storage electrode contact hole mask, then depositing a sixth polysilicon layer such that it is in contact with the source active region of the thin film transistor, and patterning the sixth polysilicon layer using the storage electrode mask, thereby forming a second storage electrode;

forming a second dielectric film over the second storage electrode, then depositing a seventh polysilicon layer, and patterning the seventh polysilicon layer using the plate electrode mask, thereby forming a second plate electrode; and depositing a fifth insulating film and a sixth insulating film over the entire exposed surface of the resulting structure obtained after the formation of the second plate electrode, selectively etching the sixth insulating film and the fifth insulating film, the fourth insulating film, the drain active region of the thin film transistor, the substrate, the third insulating film, the second insulating film and the first insulating film in a sequential manner using the bit line contact hole mask so that the drain active region of the transistor is exposed, then depositing an eighth polysilicon layer or a polycide layer such that it is in contact with the drain active region of the transistor, and patterning the eighth polysilicon layer using a bit line mask, thereby forming a bit line electrode.

5. A method in accordance with claim 4, wherein with respect to the steps of implanting P type impurity ions, those steps of implanting P type impurity ions in the higher concentration are omitted so that only those steps of implanting P type impurity ions to form the lightly doped drain structure are carried out.

6. A method in accordance with claim 4, wherein the sixth polysilicon layer for the second storage electrode is in contact with side walls of the source active region of the thin film transistor by use of an impurity implantation process.

* * * * *

UNITED STATES PATENT AND TRADEMARK OFFICE
CERTIFICATE OF CORRECTION

PATENT NO. : 5,470,776

DATED : November 28, 1995

INVENTOR(S) : Eui K. Ryou

It is certified that error appears in the above-identified patent and that said Letters Patent is hereby corrected as shown below:

```
Column 1, line 8,  replace "mole" with --more--
Column 1, line 13, replace "legions" with --regions--
Column 1, line 30, replace "wold" with --word--
Column 2, line 66, replace "fox" with --for--
Column 5, line 20, replace "polarized" with --planarized--
Column 5, line 45, replace "the" with --then--
Column 6, line 41, repalce "the" with --then--
 (second occurrence)
```

Signed and Sealed this

Sixth Day of August, 1996

Attest:

BRUCE LEHMAN

*Attesting Officer*     Commissioner of Patents and Trademarks